(12) United States Patent
Kim et al.

(10) Patent No.: US 10,490,771 B2
(45) Date of Patent: Nov. 26, 2019

(54) FLEXIBLE DISPLAY AND ELECTRONIC DEVICE INCLUDING THE SAME

(71) Applicant: LG Display Co., Ltd., Seoul (KR)

(72) Inventors: Jun-Hyung Kim, Seoul (KR); Tae-Woo Kim, Paju-si (KR); Han-Ul Lee, Seoul (KR); Jung-Kyu Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/233,962

(22) Filed: Dec. 27, 2018

(65) Prior Publication Data

US 2019/0207141 A1 Jul. 4, 2019

(30) Foreign Application Priority Data

Dec. 28, 2017 (KR) .......... 10-2017-0181802
Dec. 4, 2018 (KR) .......... 10-2018-0154569

(51) Int. Cl.
*H01L 51/52* (2006.01)
*H05K 5/00* (2006.01)
*H01L 51/56* (2006.01)
*H01L 51/00* (2006.01)
*H01L 27/32* (2006.01)

(52) U.S. Cl.
CPC ........... *H01L 51/524* (2013.01); *H01L 51/56* (2013.01); *H05K 5/0017* (2013.01); *H01L 27/323* (2013.01); *H01L 27/3244* (2013.01); *H01L 51/0097* (2013.01); *H01L 51/5253* (2013.01); *H01L 2251/5338* (2013.01)

(58) Field of Classification Search
CPC ......... H01L 2251/5338; H01L 51/5237; H01L 27/3244; H01L 51/0097; H01L 27/323; H01L 2251/558; H01L 27/3276; H01L 51/524; H01L 51/5253; H01L 51/56; G06F 1/1652; G06F 1/1616; G06F 1/1601; G06F 1/1641; G06F 1/1677; G06F 1/1681; H05K 5/0017; H05K 1/028; H05K 1/118; H05K 1/147; H05K 1/189; H05K 2201/056; H05K 2201/10128; H05K 5/0086; H05K 5/0217; H05K 5/0226; H05K 5/0247; H05K 9/0054

See application file for complete search history.

(56) References Cited

U.S. PATENT DOCUMENTS

| | | | |
|---|---|---|---|
| 2015/0043174 A1* | 2/2015 | Han | G02F 1/13452 361/749 |
| 2016/0357052 A1* | 12/2016 | Kim | G02F 1/133305 |
| 2017/0250242 A1* | 8/2017 | Ohara | H01L 27/3279 |
| 2018/0102496 A1* | 4/2018 | Kim | H01L 23/552 |
| 2018/0190936 A1* | 7/2018 | Lee | H01L 51/5253 |
| 2019/0196548 A1* | 6/2019 | Kim | G06F 1/1616 |

* cited by examiner

*Primary Examiner* — Abhishek M Rathod
(74) *Attorney, Agent, or Firm* — Seed Intellectual Property Law Group LLP

(57) ABSTRACT

Disclosed are a flexible display and an electronic device including the same, in the flexible display, a back plate has an improved structure so as to stably support a display panel even during repeated folding and unfolding operations, and also the flexible display can prevents sagging or deformation of specific constituent elements therein.

20 Claims, 17 Drawing Sheets

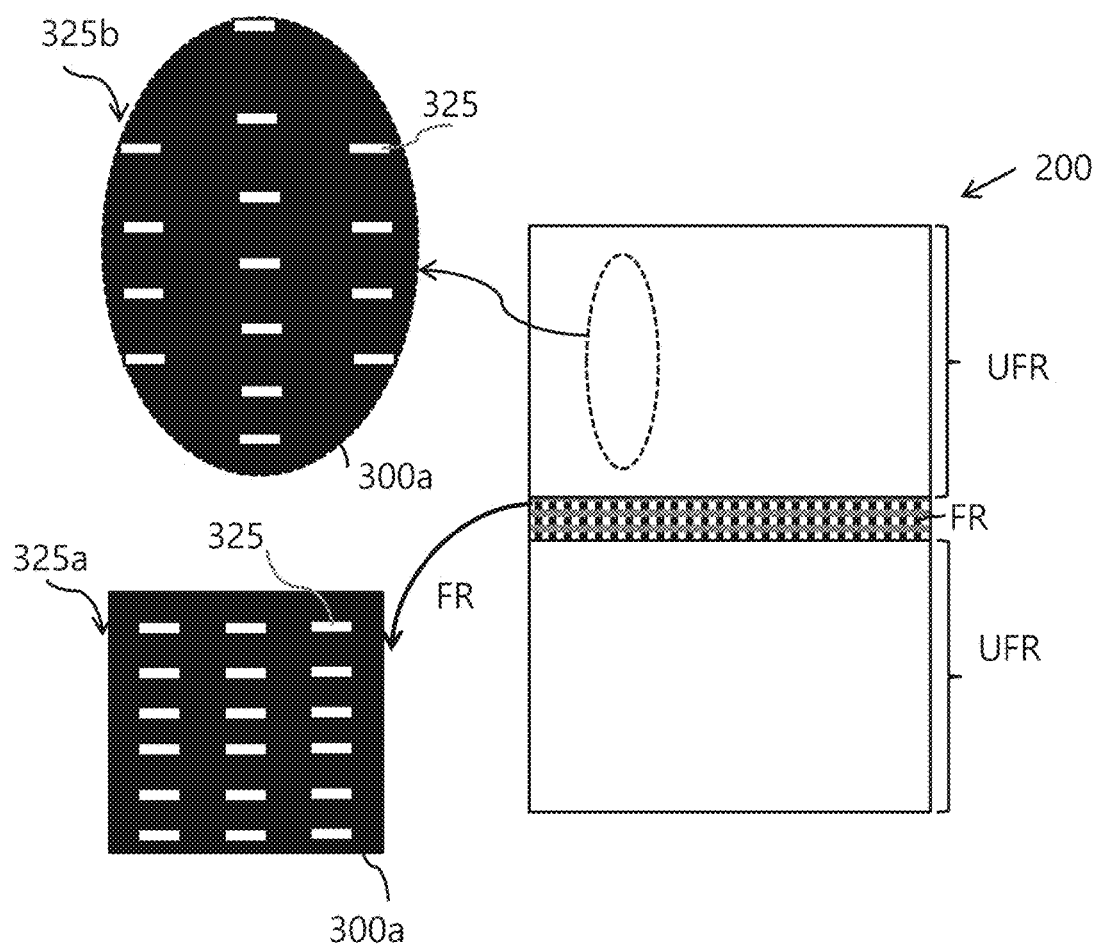

FLEXIBLE DISPLAY AND ELECTRONIC DEVICE INCLUDING THE SAME

CROSS-REFERENCE TO RELATED APPLICATION(S)

This application claims the benefit of Korean Patent Application No. 10-2017-0181802, filed on Dec. 28, 2017 and Korean Patent Application No. 10-2018-054569, field on Dec. 4, 2018, which are hereby incorporated by reference as if fully set forth herein.

BACKGROUND

Technical Field

The present disclosure relates to a flexible display, and more particularly, to a flexible display, which maintains stiffness even during frequent folding operations and is reliable, and a device including the same.

Description of the Related Art

An image display, which reproduces various pieces of information on a screen, is a core technology of the information and communication age, and is being developed in the direction of becoming thinner, lighter, and having higher performance. Thus, as a flat panel display capable of reducing the disadvantageous weight and volume of a cathode ray tube (CRT), for example, an organic light-emitting display, which enables self-luminescence and obviates a light source unit, is in the spotlight.

In such an organic light-emitting display, a plurality of pixels is arranged in a matrix form to display an image. Here, each pixel includes a light-emitting element and a pixel-driving circuit constituted by a plurality of transistors, which drive the light-emitting element independently of each other.

Recently, with regard to various applications, there is increasing demand for a flexible display, which is easy to carry in a pocket or a small pouch and is capable of displaying an image on a larger screen than when being carried. Such a flexible display is folded or partially bent when it is carried or stored, but is unfolded when displaying an image, which may increase an image display area and may cause an increase in user visual sensation and viewing realism.

The flexible display basically includes a display panel, which displays an image, and a back plate, which supports and protects the display panel from the underside thereof.

The back plate is formed of a material having stiffness higher than that of the display panel and protects the display panel from the underside thereof. However, since the stiffness of the back plate is much higher than the stiffness of the display panel, a stiff folding portion of the back plate may cause damage, such as cracks, to the display panel when folding and unfolding operations are repeated.

When a back plate having stiffness similar to that of the display panel is provided in order to prevent damage to the display panel described above, however, the back plate may have a low specific gravity and may not fully support the display panel, and the flexible display may not maintain a predetermined shape thereof in the unfolded state thereof, which may cause poor visibility.

Therefore, flexible displays devised to date fail to maintain reliability due to repetition of folding and unfolding operations, and there is a need to solve this problem. In addition, in consideration of a difference in stiffness between constituent elements, efforts have been made to prevent damage to the flexible display panel.

BRIEF SUMMARY

Accordingly, the present disclosure is directed to a flexible display and an electronic device including the same that substantially obviate one or more problems due to limitations and disadvantages of the related art.

The present disclosure has been provided to solve the problems described above, and an object of the present disclosure is to provide a flexible display and an electronic device including the same, in which a back plate has an improved structure so as to stably support a display panel even during repeated folding and unfolding operations, and which may prevent sagging or deformation of specific constituent elements in the device.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, the present disclosure provides a flexible display and an electronic device including the same, in which a back plate has an improved structure so as to stably support a display panel even during repeated folding and unfolding operations, and which may prevent sagging or deformation of specific constituent elements in the device.

According to one embodiment of the present disclosure, a flexible display includes a display panel, and a back plate, which is divided into a folding portion and a non-folding portion and includes a first layer formed of a material having stiffness higher than that of the display panel, a first opening pattern formed in the first layer so as to correspond to the folding portion and having a first density, and a second opening pattern formed in the first layer so as to correspond to the non-folding portion and having a second density lower than the first density.

The non-folding portion may be divided into two or more areas so that one area includes the second opening pattern having the second density and the other area includes a third opening pattern having a density different from the first and second densities.

A specific gravity of the back plate including the opening patterns may be reduced with increasing distance from the folding portion.

The first density may have a fixed value in the folding portion, and the second density may be gradually reduced in the non-folding portion with increasing distance from the folding portion.

The first layer may be formed of stainless steel.

The back plate may further include a skin layer on at least one surface of the first layer.

The flexible display may further include an adhesive layer between the display panel and the back plate.

The skin layer may be formed of a resin.

The first and second opening patterns may be filed with the resin.

In accordance with another aspect, the present disclosure provides an electronic device including a display panel, a back plate, which is divided into a folding portion and a non-folding portion and includes a first layer formed of a material having stiffness higher than that of the display panel, a first opening pattern formed in the first layer so as to correspond to the folding portion and having a first density, and a second opening pattern formed in the first layer so as to correspond to the non-folding portion and having a second density lower than the first density, and a case configured to accommodate the display panel and the back plate therein.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIGS. 9A to 9C are plan views illustrating various embodiments of the back plate of the present disclosure;

DETAILED DESCRIPTION

Figure 1:
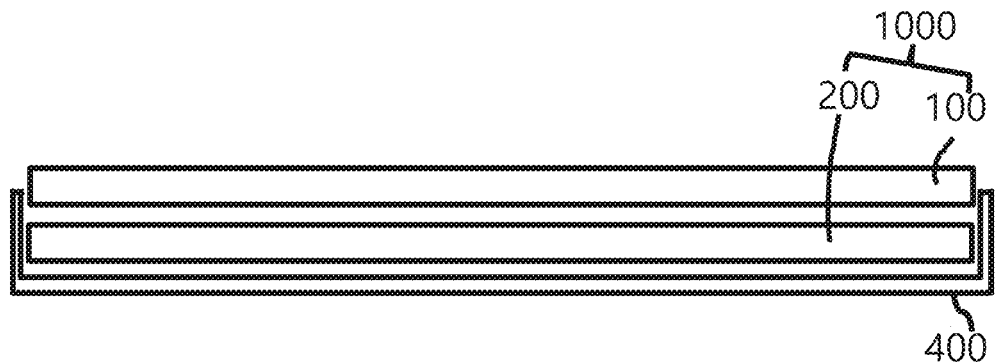
FIG. 1 is a cross-sectional view illustrating an electronic display including a flexible display according to a first embodiment of the present disclosure.

Hereinafter, exemplary embodiments according to the present disclosure will be described in detail with reference to the accompanying drawings. Wherever possible, the same reference numbers will be used throughout the drawings to refer to the same or like parts. In addition, in the following description of the embodiments, a detailed description of known functions and configurations incorporated herein will be omitted when it may impede the understanding of the embodiments. In addition, the names of constituent elements used in the following description are selected in consideration of ease of writing of the specification, and may differ from names of parts of actual products.

Further, it will be understood that, when an element or a layer is referred to as being "on" another element, it can be directly on the other element or layer or intervening elements or layers may also be present. On the other hand, it will be understood that, when an element or a layer is referred to as being "in contact with" another element, it is directly on the other element without intervening elements or layers therebetween.

In the drawings, the thickness or size of each constituent element is illustrated for clarity and convenience, and the present disclosure is not necessarily limited to the illustrated thickness or size of the constituent element.

Hereinafter, exemplary embodiments of the present disclosure will be described with reference to the drawings.

A display of the embodiments, which will be described below, exemplifies a foldable display, the center of which is foldable, or a bendable display, the edge of which is bendable, but a folding portion may be any portion of the display. In a flexible display of the present disclosure, deformation of a lower plate and a magnetic body corresponding to the folding portion may be implemented in a manner such that the deformation position is changeable based on a change in the position of the folding portion of the display. Thus, the flexible display of the present disclosure may be referred to using any of various names, such as "foldable display", "bendable display", or "rollable display", as long as it is flexible.

FIG. 1 is a cross-sectional view illustrating an electronic display including a flexible display according to a first embodiment of the present disclosure.

As illustrated in FIG. 1, the flexible display of the present disclosure, designated by reference numeral 1000, includes a flat-panel-type display panel 100 and a back plate 200, which supports the display panel 100 with a lower surface thereof.

An adhesive layer (adhesive sheet) may be interposed between the display panel 100 and the lower surface of the back plate 200 in order to attach the two to each other. A fixing unit may be added to a case 400, in which the display panel 100 and the back plate 200 are accommodated, so as to be accommodated in the case 400.

The electronic device of the present disclosure refers to the configuration including the display panel 100, the back plate 200, and the case 400. The electronic device may further include a flexible printed circuit board (not illustrated) on one side of the display panel 100 in order to apply an electrical signal to the display panel 100. The flexible printed circuit board may be folded into a gap between the back plate 200 and the case 400 so as to be attached thereto.

A board having a heat dissipation function or a light blocking function, a battery (not illustrated), and the like may further be provided between the back plate 200 and the case 400.

The flexible display 1000 of the present disclosure is foldable or bendable owing to respective flexible constituent elements thereof, as the name thereof indicates.

In particular, the display panel 100, on which an image is displayed, is manufactured in a thin film form without a hard material such as glass.

The display panel in the electronic device may not alone support a predetermined shape of the electronic device and is vulnerable to external shocks. Therefore, the back plate 200, which has stiffness higher than that of the display panel 100, is provided on the surface of the display panel 100 opposite the surface on which an image is displayed.

The back plate 200 may be formed of, for example, stainless steel (SUS), or a plastic material that maintains a constant thickness and has a high hardness.

In the flexible display 100 of the present disclosure, the back plate 200 is shaped to prevent damage to a portion of the display panel 100 that corresponds to a relatively flexible folding portion thereof. This will be described below in detail.

Figure 2:
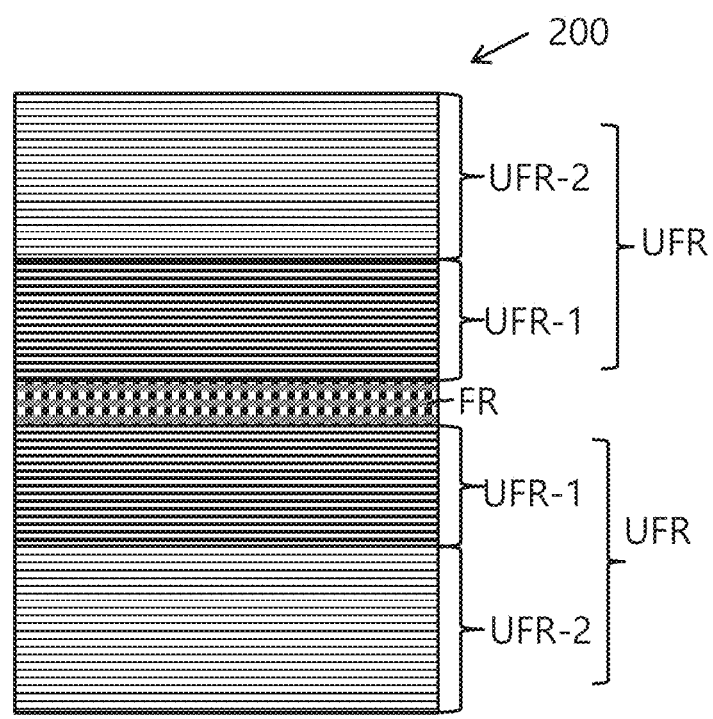
FIG. 2 is a plan view illustrating a back plate of FIG. 1.

FIG. 2 is a plan view illustrating the back plate of FIG. 1, and FIGS. 3A to 3C are cross-sectional views taken along line I-I', line II-II', and line III-III' of FIG. 2.

Figure 3A:
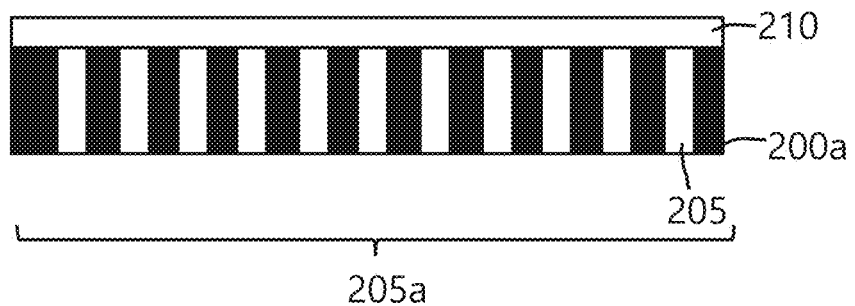
FIGS. 3A to 3C are cross-sectional views taken along line I-I', line II-II', and line III-III' of FIG. 2.
Figure 3B:
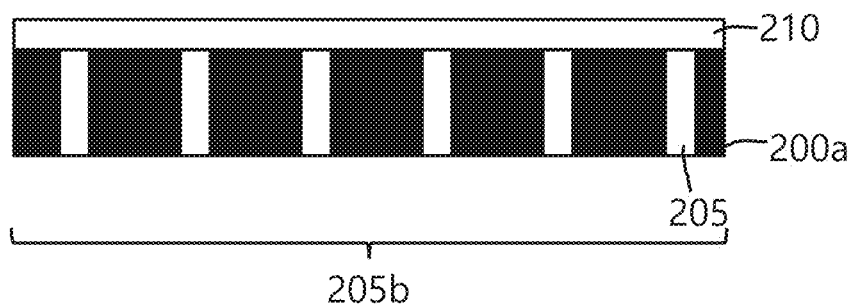
Figure 3C:
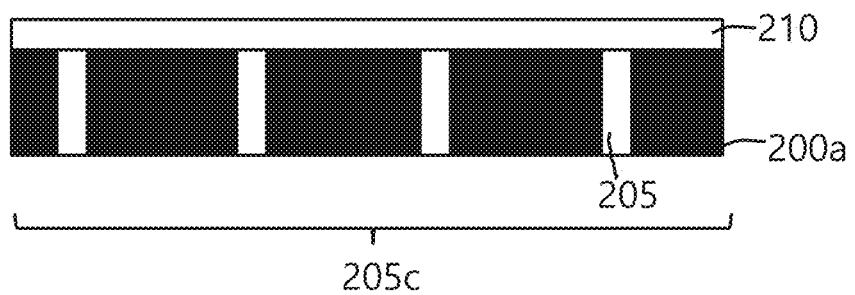

As illustrated in FIGS. 2 to 3C, the back plate 200, which is used in the flexible display of the present disclosure, is divided into a folding portion FR and a non-folding portion UFR. The back plate 200 includes a first layer 200a, which is formed of a material having stiffness higher than that of the display panel (see 100 of FIG. 1), a first opening pattern 205a, which is provided in the first layer 200a to correspond to the folding portion FR and has a first density, and a second opening pattern 205b and a third opening pattern 205c, which are provided in the first layer 200a to correspond to the non-folding portion UFR and have densities lower than the first density. Reference to an "opening pattern," as used herein, refers to a pattern of openings or hollows formed in the back plate 200. For example, the openings 205 of FIGS. 2 through 3C include empty space extending at least partially into the first layer 200a from a surface thereof.

The first layer 200a has stiffness required to support the display panel 100 located thereabove. To this end, the first layer 200a may include a material having higher stiffness than the display panel 100, for example, at least one of stainless steel described above, amorphous metal, amorphous silicon, and Invar.

The first layer 200a may include at least one of stainless steel, amorphous metal, amorphous silicon, and Invar. That is, the first layer 410a may be formed of one of the above-enumerated materials, or may be formed of a laminated, alloyed, or plated material of some of the above-enumerated materials.

Stainless steel is fabricated by alloying iron with chrome or the like in order to improve the corrosion resistance of iron, and is broadly classified into iron-chromium-based ferritic stainless steel and iron-nickel-chromium-based austenitic stainless steel. The basic components of stainless steel are iron and chrome, and nickel may be selectively included depending on the type of stainless steel. In addition, the elasticity of stainless steel may be adjusted by varying the content ratio of chrome.

Amorphous metal is a coagulation having an irregular arrangement of atoms like glass or a liquid, and is produced when the growth of crystals in a raw metal material is hindered upon rapid quenching. Such amorphous metal is superior to general metal having a regular arrangement of atoms from the viewpoint of corrosion resistance and elasticity.

Amorphous silicon may also be used for the first layer 410a. Amorphous silicon is similar to amorphous metal from the viewpoint of formlessness, but has higher elasticity than amorphous metal.

Invar is a Fe—Ni alloy and has excellent corrosion resistance and high tensile strength. Invar is comparable with stainless steel according to whether or not it contains chrome.

Considering the material itself, stainless steel and Invar have high stiffness and amorphous metal and amorphous silicon have high elasticity, but the internal atomic linkage and stiffness of the material may be controlled by adjusting the composition of a metal alloy included therein or the cooling rate thereof. Thereby, all of the above-enumerated materials may be controlled so as to have higher stiffness than the display panel and high availability with regard to a folding operation.

In the example illustrated in FIGS. 2 to 3C, the non-folding portion UFR provided on either side of the folding portion FR is divided into two areas, and the second and third opening patterns 205b and 205c having different densities are provided respectively in the two divided areas.

In the illustrated example, the folding portion FR is located at the center of the first layer 200a to divide the first layer 200a in two, but this is merely given by way of example. The position of the folding portion FR may be changed according to device requirements. As illustrated, the folding portion FR may be provided along one side of the display panel 100 and the back plate 200, or may be provided in a diagonal direction.

In the flexible display of the present disclosure, it is meaningful that the non-folding portion UFR has the opening patterns 205b and 205c, and the density of the opening patterns 205b and 205c decreases with increasing distance from the folding portion FR.

The reason why the back plate 200 has the first opening pattern 205a so as to correspond to the folding portion FR is to partially divide an area, which undergoes folding and repeated contraction and extension, thereby enabling stable implementation of folding. This also serves to reduce a contact area between the back plate 200 and the display panel 100, which face each other, thereby alleviating shocks applied to the display panel 100, which is relatively flexible, during folding.

In addition, the reason why the back plate 200 has the second and third opening patterns 205b and 205c having different densities in respective areas UFR-1 and UFR-2 so as to correspond to the non-folding portion UFR is to prevent the boundary of the folding portion FR and the non-folding portion UFR from being visible. This is because, when the folding portion FR, in which the density of the opening pattern is high, is provided only in a part of the back plate 200 for cooperation of the display panel 100 and the back plate 200 upon folding, the folding portion FR and the non-folding portion UFR have a difference in density. In addition, this serves to prevent sagging of the folding portion FR, which has therein the opening pattern at high density and a small specific gravity.

For reference, that the density of the opening pattern is high means that an amount of empty space is large in the first layer 200a of the back plate 200 and that the specific gravity of the first layer 200a is reduced. On the other hand, that the density of the opening pattern is low means that an amount of an empty space is small in the first layer 200a and that the specific gravity of the first layer 200a is increased.

As illustrated in FIGS. 3A to 3C, the back plate 200 may further include a skin layer 210 on at least one surface of the first layer 200a. The skin layer 210 serves to prevent the opening patterns 205a, 205b, and 205c from being visible by filling the empty space in the opening patterns 205a, 205b, and 205c.

The skin layer 210 is formed of a material having flexibility higher than that of the first layer 200a, which is the center layer of the back plate 200, such as a resin.

When the skin layer 210 is formed, the opening patterns 205a, 205b, and 205c may be filled with the constituent material of the skin layer 210.

In the illustrated example, the back plate 200 centrally includes the folding portion FR, and the non-folding portion UFR is divided into two areas UFR-1 and UFR-2 on either side of the folding portion FR.

In the illustrated flexible display, the folding portion FR is located at the center of the back plate 200 to divide the back plate 200 in two. For symmetry, non-folding portions UFR, which are located respectively on one side and the other side of the folding portion FR, include the same number of areas having the same shape.

In the flexible display of the present disclosure, in order to prevent the folding portion FR from being visually distinguished from the remaining portions due to the first opening pattern 205a, having a first density that is high, and to prevent the boundary of the folding portion FR and the non-folding portion UFR from being visible, an opening pattern, which has a density lower than the first density, is provided in the non-folding portion UFR.

Here, the number of areas into which the non-folding portion UFR may be divided may be changed depending on the size of the back plate 200. The larger the area of the flexible display, the larger the number of areas into which the non-folding portion UFR may be divided.

The number of areas into which one non-folding portion UFR may be divided may be two or more. This may disperse the stress applied to the back plate 200 and may prevent a specific area from being visible due to a remarkable difference in density between any specific area and the opening pattern.

The density of the opening pattern decreases with increasing distance from the folding portion FR. As illustrated, the density of the opening pattern may have a fixed value for each area FR, UFR-1 and UFR-2, and may be reduced stepwise in the order of the folding portion FR, the first non-folding portion UFR-1, and the second non-folding portion UFR-2. Alternatively, the density of the opening pattern may be linearly reduced in the entire non-folding portion UFR, excluding the folding portion FR, with increasing distance from the folding portion FR.

Hereinafter, the stress and the amount of deformation for each area depending on the density of the opening pattern for each area of the back plate of the flexible display according to the present disclosure will be described.

Figure 4A:
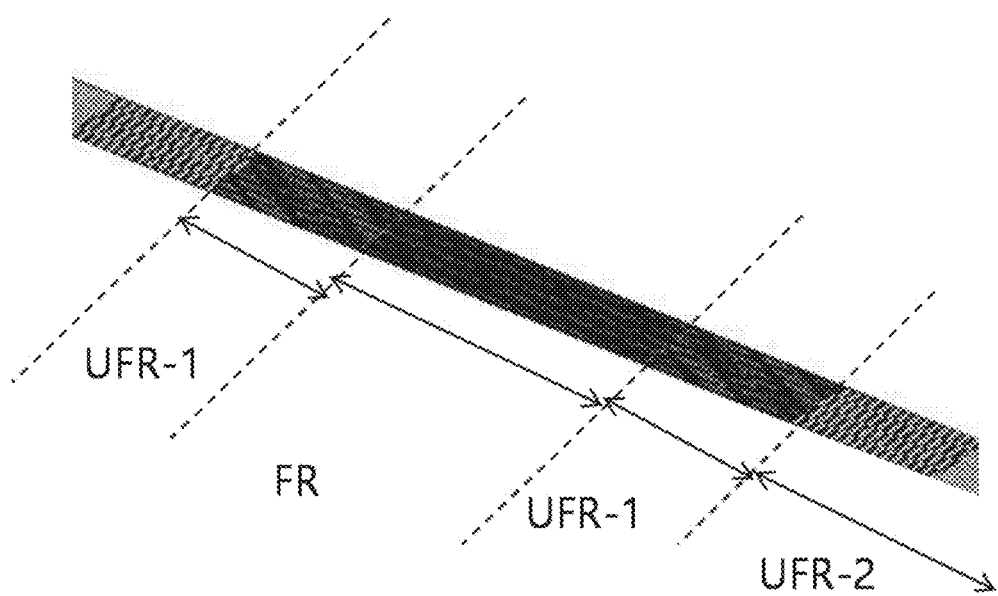
FIGS. 4A and 4B are simulation views illustrating the density of a pattern and the stiffness thereof for each area of FIG. 2.
Figure 4B:
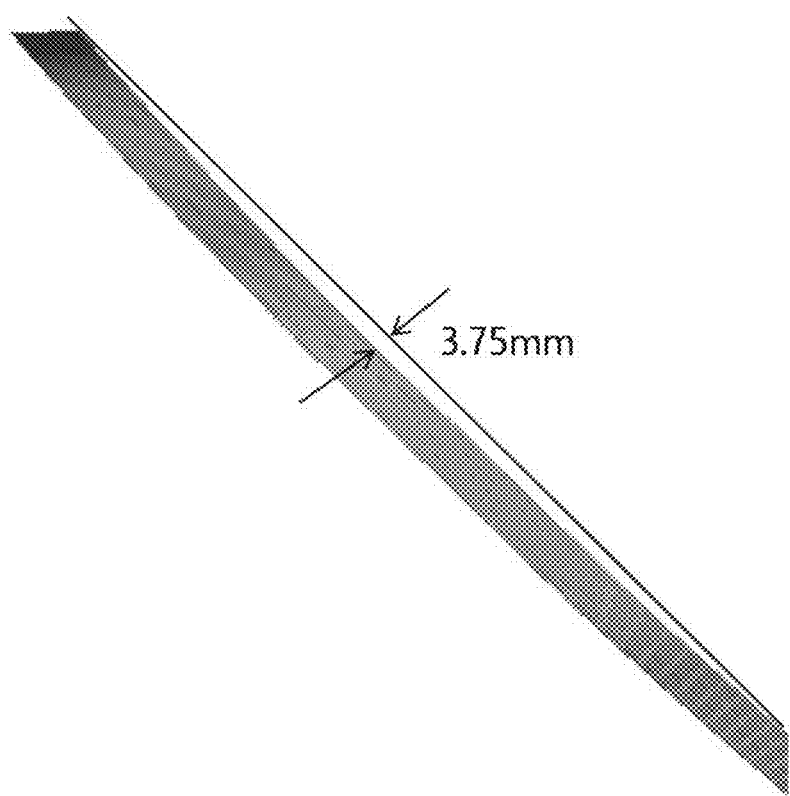

FIGS. 4A and 4B are simulation views illustrating the density of the pattern and the stiffness thereof for each area of FIG. 2.

When cutting the back plate of FIG. 2 in the vertical direction, the density of the opening pattern is as illustrated in FIG. 4A. The opening pattern is the densest at the center of the back plate 200, i.e., at the folding portion, and the density of the opening pattern is gradually reduced in the non-folding portion with increasing distance from the folding portion. In this case, it could be found that the stress applied to the folding portion FR of the back plate 200 is 26.76 MPa, which is smaller than that in the case in which the opening pattern is located only in the folding portion FR.

In addition, considering the amount of deformation of the back plate when unfolding the back plate of the flexible display of the present disclosure after multiple folding operations, displacement of 3.75 mm could be found, as illustrated in FIG. 4B.

Hereinafter, a comparative example in which a back plate has an opening pattern selectively provided in a folding portion will be described in comparison with the flexible display of the present disclosure.

Figure 5:
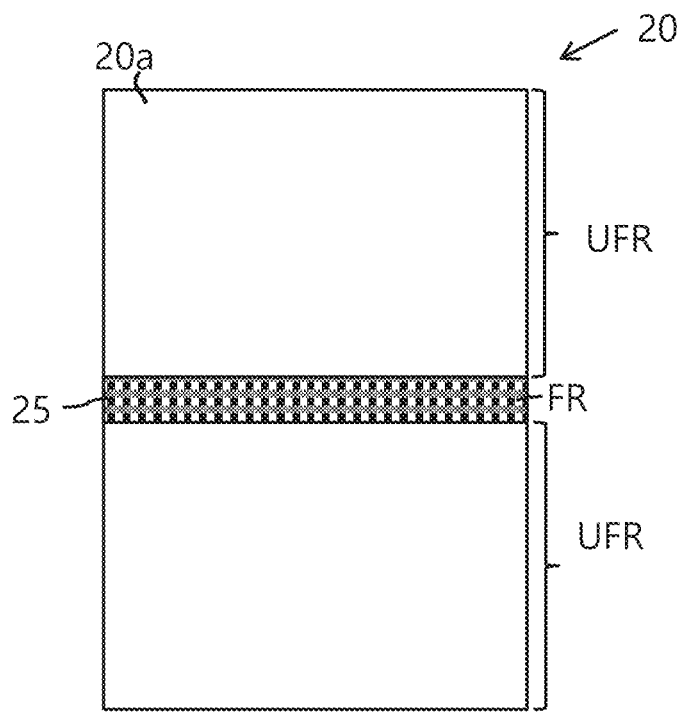
FIG. 5 is a plan view illustrating a back plate according to a comparative example.
Figure 6A:
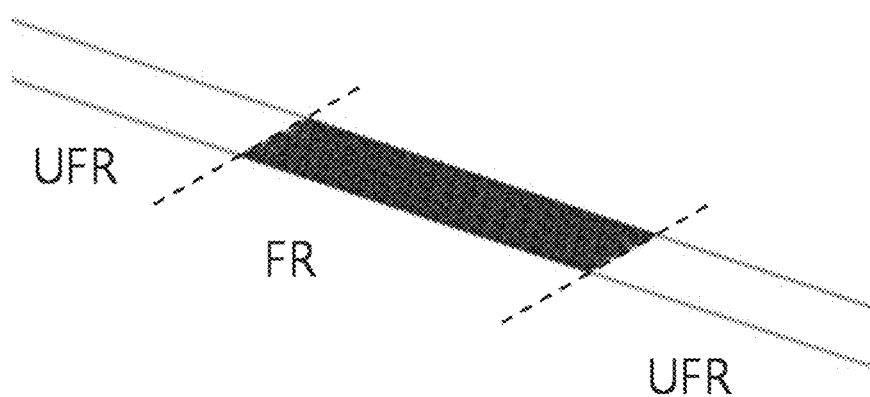
FIGS. 6A and 6B are simulation views illustrating the density of a pattern and the stiffness thereof for each area of the back plate according to the comparative example.
Figure 6B:
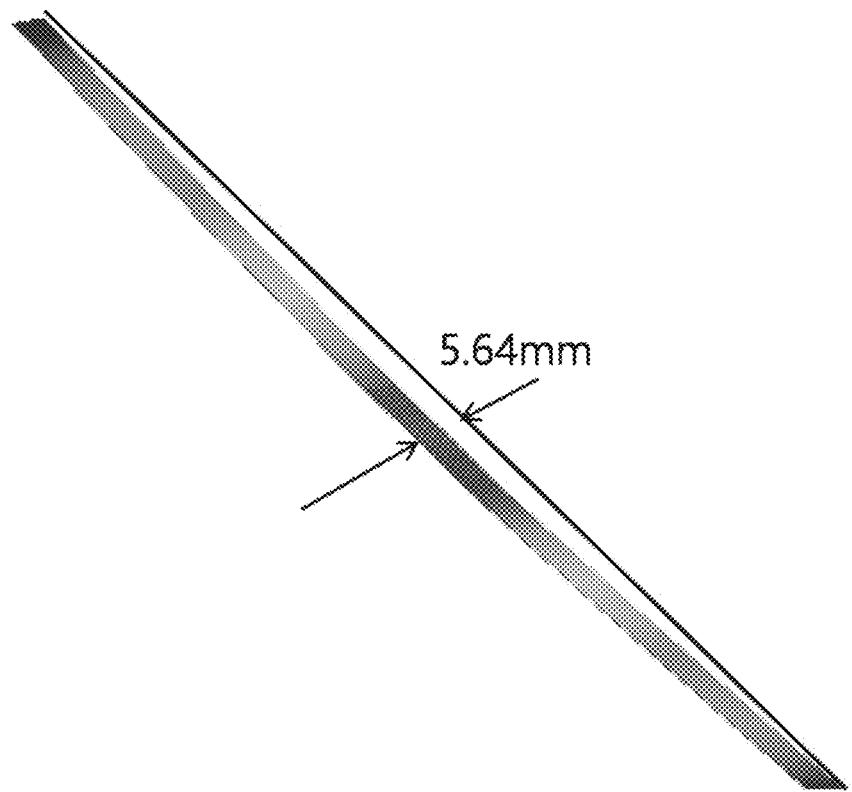

FIG. 5 is a plan view illustrating a back plate according to a comparative example, and FIGS. 6A and 6B are simulation views illustrating the density of a pattern and the stiffness thereof for each area of the back plate according to the comparative example.

As illustrated in FIG. 5, the back plate 20 according to the comparative example has an opening pattern 25, which is selectively provided only in the folding portion FR. In the back plate 20 according to the comparative example, the opening pattern 25 is formed only in the folding portion FR by a first layer 20a.

As illustrated in FIG. 6A, it was found that the stress applied to the folding portion FR of the back plate 20 was 39.47 MPa, which is 1.485 times the stress applied to the back plate of the present disclosure illustrated in FIG. 4A.

Then, considering the amount of deformation of the back plate when unfolding the back plate of the comparative example after multiple folding operations, displacement of 5.64 mm was found, as illustrated in FIG. 6B.

In the comparative example, the density of the opening pattern 25 is set to be equal to the density of the opening pattern 205a in the folding portion FR of the present disclosure.

That is, as illustrated in FIGS. 6A and 6B, the stress applied to the folding portion of the back plate of the comparative example is 39.74 MPa, which is 1.485 times that in the back plate of the present disclosure, and the displacement thereof is 5.64 mm, which is 1.504 times that in the back plate of the present disclosure. That is, when an opening pattern is concentrated on a specific area, stress is concentrated on the specific area, which means that deformation of the back plate is visible.

Figure 7A:
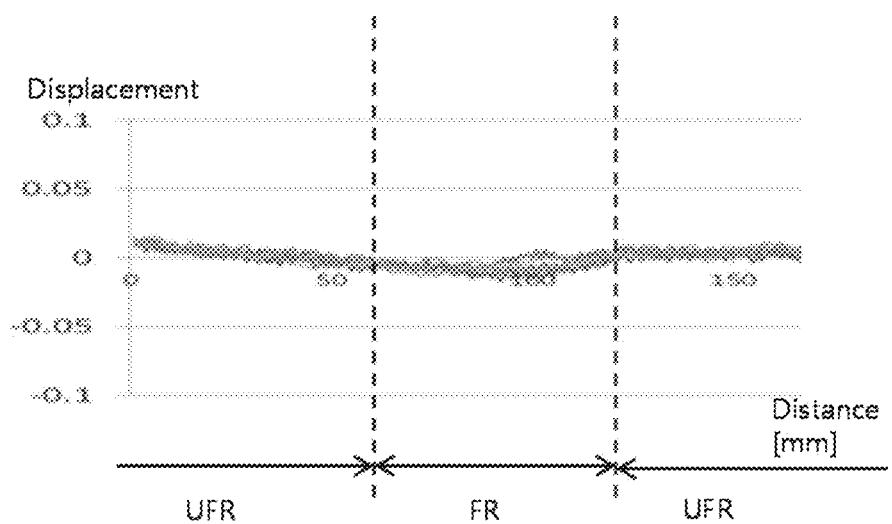
FIGS. 7A and 7B are simulation views illustrating the flatness of the back plates according to the comparative example and the present disclosure.
Figure 7B:
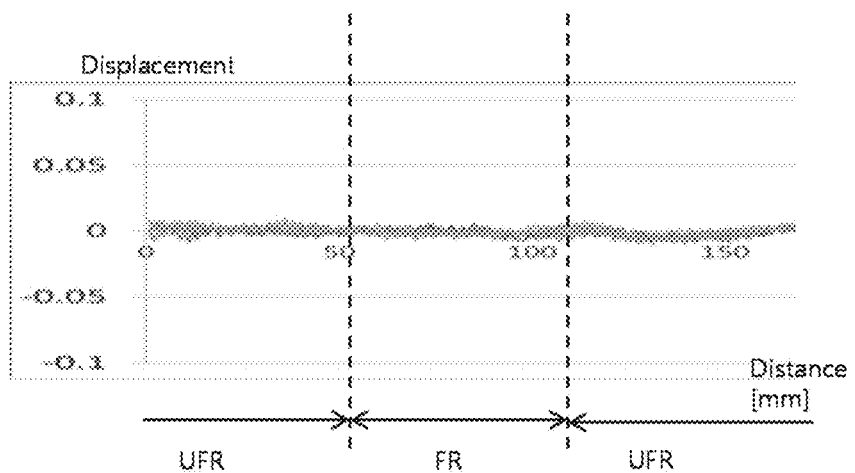

FIGS. 7A and 7B are simulation views illustrating the flatness of the back plates according to the comparative example and the present disclosure.

In FIGS. 7A and 7B, in common, the coordinate value "0" on the vertical axis means that flatness is maintained, and other values excluding "0" mane that flatness is not maintained.

As illustrated in FIG. 7A, in the back plate of the comparative example, due to a difference in stiffness between a folding portion and a non-folding portion, flatness is not maintained in the folding portion or at the boundary of the folding portion and the non-folding portion.

On the other hand, as illustrated in FIG. 7B, it could be found that the back plate of the present disclosure has a difference in density between opening patterns and both the folding portion FR and the non-folding portion UFR include opening patterns, so that flatness is substantially maintained in the entirety thereof.

Figure 8:
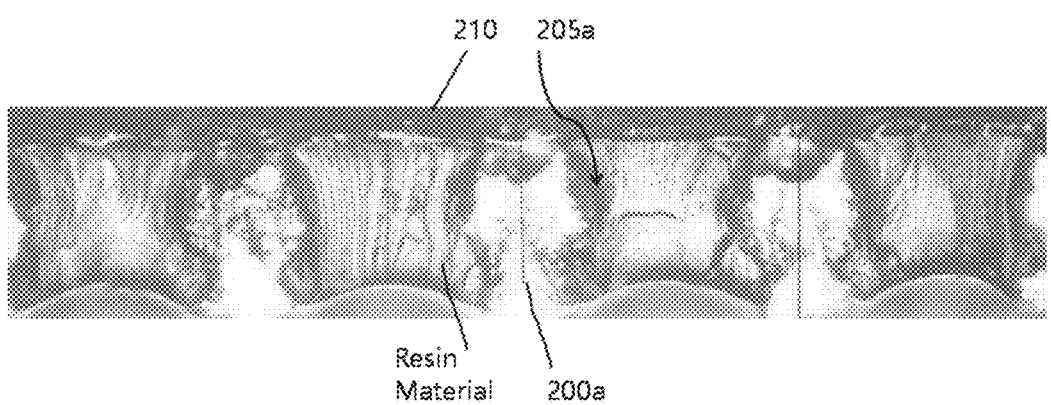
FIG. 8 is a photograph illustrating a first area of the back plate of the present disclosure.

FIG. 8 is a photograph illustrating a first area of the back plate of the present disclosure.

The back plate 200 of the present disclosure, as illustrated in FIGS. 3A to 3C, includes the skin layer 210 on at least one surface of the first layer 200a, in addition to the opening patterns 205a, 205b, and 205c of the first layer 200a, which have a difference in density.

The skin layer 210 is formed of a resin material and has a flat surface. As illustrated in FIG. 8, the opening patterns 205a, 205b and 205c in the first layer 200a may be filled with the skin layer 210, which reduces a significant difference in density between the portion in which the opening patterns are formed and the portion in which the first layer 200a remains, thereby preventing the opening patterns 205a, 205b and 205c from being visible from the outside. The skin layer 210 has a flat upper surface.

Figure 9A:
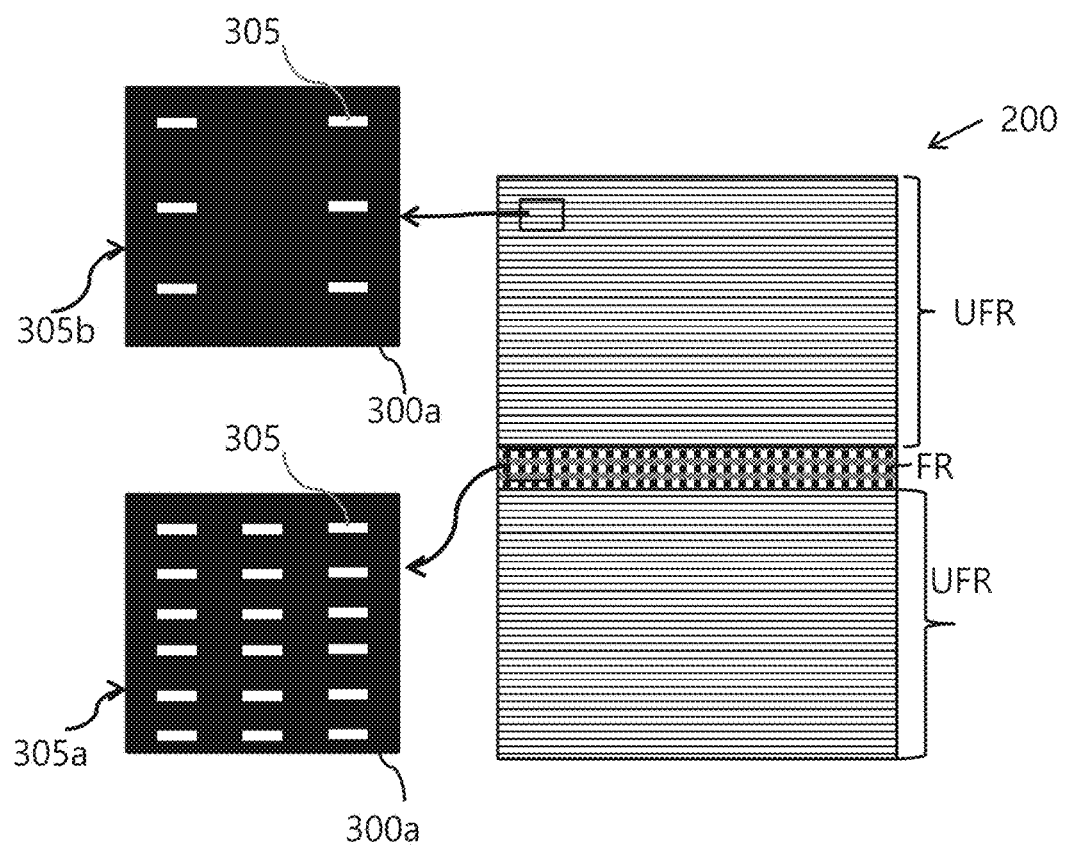
Figure 9B:
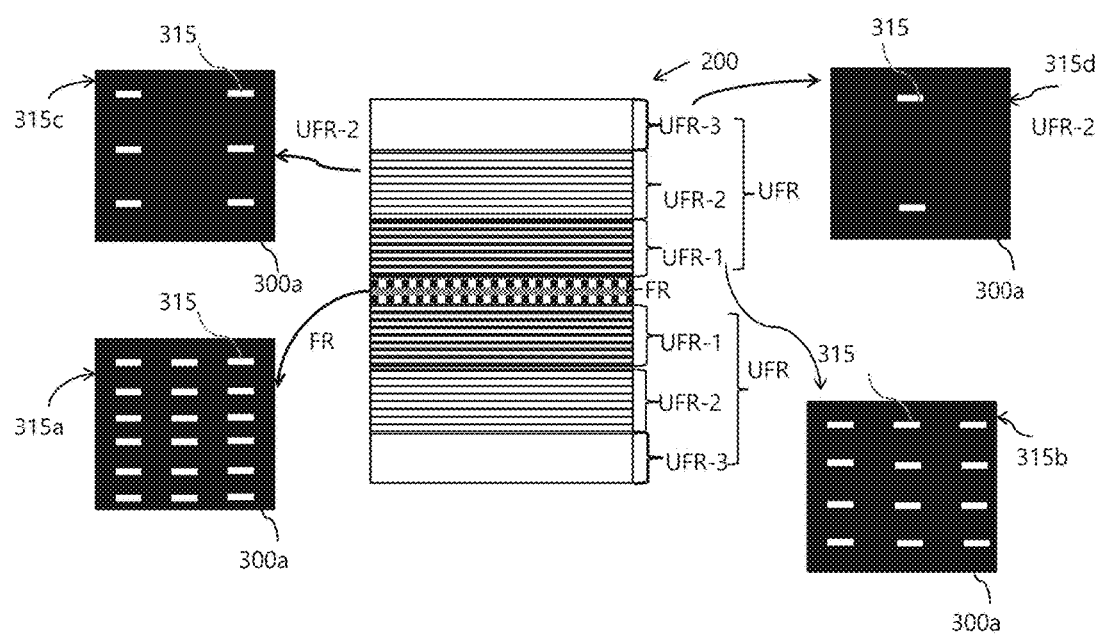

FIGS. 9A to 9C are plan views illustrating various embodiments of the back plate of the present disclosure.

In another embodiment of the present disclosure, in the back plate 200, as illustrated in FIG. 9A, a first layer 300a may be divided into a folding portion FR and a non-folding portion UFR, and opening patterns 305a and 305b, which are comprised of a plurality of openings 305, may be formed to have a first density in the folding portion FR and a second density in the non-folding portion UFR. Even in this case, the first density in the folding portion FR is larger than the second density in the non-folding portion UFR. The opening pattern 305a in the folding portion FR may be more densely arranged than the opening pattern 305b in the non-folding portion UFR.

FIG. 9B illustrates still another embodiment of the present disclosure. In the first layer 300a of the back plate 200, the non-folding portion UFR provided on either side of the folding portion FR is divided into three areas UFR-1, UFR-2 and UFR-3, and opening patterns 315a, 315b, 315c and 315d comprising openings 315 are sequentially reduced in density with increasing distance from the folding portion FR.

FIG. 9C illustrates a further embodiment of the present disclosure. In the first layer 300a of the back plate 200, an opening pattern 325a, which is comprised of openings 325, is distributed at a first density in the folding portion FR, and an opening pattern 325b is distributed at a density, which is similar to the first density, in a portion of the non-folding portion UFR that is adjacent to the folding portion FR, and is gradually reduced in density with increasing distance from the folding portion FR.

In all of the above-described configurations, the folding portion FR and the non-folding portion UFR of the back plate 200 have a difference in the density of the opening pattern, which may secure the flexibility of the folding portion FR of the back plate, may reduce a difference in stiffness between the folding portion and the non-folding portion, and may prevent the boundary of the folding portion and the non-folding portion from being visible.

In the above-described embodiments, similarly, as described above with reference to FIGS. 3A to 3C, a skin layer (not illustrated, see "210" in FIGS. 3A to 3C) may be provided on one surface of the first layer 300a, so that an empty space of the opening patterns 305a and 305b, 315a, 315b, 315c and 315c, or 325a and 325b may be filled with the resin material of the skin layer.

As described above, in the flexible display of the present disclosure, the opening pattern is provided in the folding portion, and the openings patterns having different densities are sequentially or gradually provided in the non-folding portion, which may reduce a difference in stiffness between areas of the back plate, thereby preventing unbalance in shape due to sagging of a specific area.

In addition, in the back plate for supporting the display panel, the folding portion and the non-folding portion are provided with opening patterns having different specific gravities, which may allow the back plate to perform folding in response to folding of the display panel and may prevent a difference in pattern between the non-folding portion and the folding portion from being visible upon unfolding.

In addition, the skin layer, which has stiffness lower than that of a main body of the back plate, may be provided on the surface of the back plate so that the opening patterns are filled with the material of the skin layer, which may prevent the opening patterns from being visible due to an empty space thereof.

Figure 10:
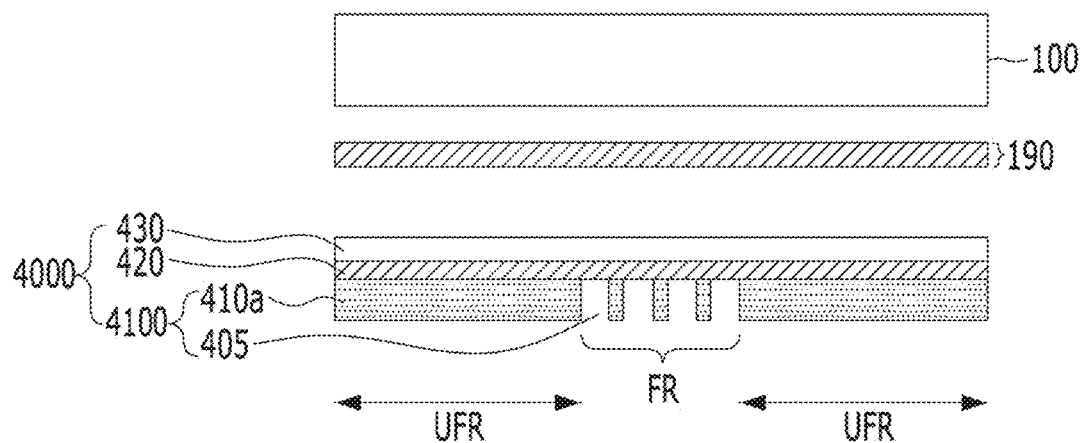
FIG. 10 is a cross-sectional view illustrating an electronic device including a flexible display according to a second embodiment of the present disclosure.
Figure 11:
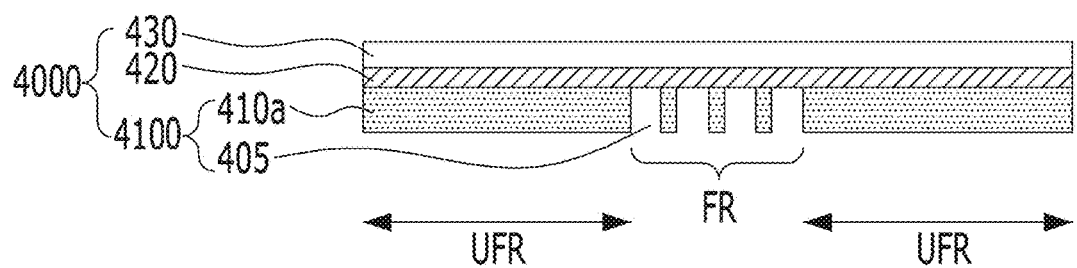
FIG. 11 is a cross-sectional view illustrating a back plate in FIG. 10.

FIG. 10 is a cross-sectional view illustrating an electronic device including a flexible display according to a second embodiment of the present disclosure, and FIG. 11 is a cross-sectional view illustrating a back plate in FIG. 10.

As illustrated in FIGS. 10 and 11, the electronic device including the flexible display according to the second embodiment of the present disclosure includes the display panel 100, a back plate 4000 which supports the display panel from the lower side thereof, and a first adhesive layer 190 which bonds the display panel 100 and the back plate 4000 to each other.

The first adhesive layer 190 may be mainly formed of a thermosetting resin such as an epoxy resin, a silicon resin, a polyester resin, a polyurethane resin, or a phenol resin, or a piece of pressure-sensitive adhesive tape. The thermosetting resin is generally in a liquid phase and is applied to one of the display panel 100 and the back plate 4000. After the display panel 100 and the back plate 4000 are bonded to each other via the thermosetting resin, a predetermined amount of heat is applied thereto to harden the thermosetting resin so that the first adhesive layer 190 is formed in a solidified state. The piece of pressure-sensitive adhesive tape has an adhesive property on both surfaces thereof. After one surface of the piece of pressure-sensitive adhesive tape is attached to one of the display panel 100 and the back plate 4000, the other surface of the piece of pressure-sensitive adhesive tape is attached to the other one of the display panel 100 and the back plate 4000, so that the display panel 100 and the back plate 4000 are bonded to both surfaces of the piece of pressure-sensitive adhesive tape by the weight of the display panel 100 or upon receiving additional pressure.

Although not illustrated, the above-described case 400 in FIG. 1 may further be provided around and below the flexible display so as to accommodate therein the flexible display, which is formed by bonding the display panel 100 and the back plate 4000 to each other via the first adhesive layer 190. That is, the case may be located at the lateral side of the display panel 100 and the back plate 4000 and at the lower side of the back plate 4000.

Meanwhile, the back plate 4000 includes a first rigid support portion 4100 having a first opening pattern 405 for the folding portion FR, a second adhesive layer 420 disposed on the support portion 4100, and a skin layer 430 disposed on the second adhesive layer 420. The first opening pattern 405 may comprise a plurality of openings, as described herein.

The support portion 4100 includes the first opening pattern 405 formed between neighboring portions of a first layer 410a. The first opening pattern 405 is an area in which the first layer 410a is not present, and the support portion 4100 corresponds to the first layer 410a from which the area of the first opening pattern 405 in which a first layer material is patterned is removed.

One feature of the electronic device according to the second embodiment is that the skin layer 430, which is formed of a material similar to that of the first layer 410a and has higher elastic restoration ability than the first layer 410a, and the second adhesive layer 420 between the first layer 410a and the skin layer 430 are further provided above the first layer 410a. Although a resin material is used in the above-described first embodiment, in the second embodiment, the skin layer 430 includes at least one of stainless steel, amorphous metal, and Invar, which have higher elastic restoration ability than the first layer 410a, and is formed of an alloy or an inorganic material. In the laminated structure of the back plate 4000, the skin layer 430 and the first layer 410 are disposed above and below the second adhesive layer 420 interposed therebetween. Elastic restoration ability refers to the ability of a material to return to an original shape after elastic deformation, such as being folded or bent.

The first layer 410a and the skin layer 430 are formed of an alloy or an inorganic material of the same kind, and are controllable in elastic restoration ability by varying the composition of the alloy or by varying the thickness thereof. Alternatively, the first layer 410a and the skin layer 430 may be selected from materials having different elastic restoration abilities. For example, the first layer 410a may be formed of stainless steel or Invar, and the skin layer 430 may be formed of amorphous metal or amorphous silicon.

By further providing the skin layer 430 in the electronic device, it is possible to further protect the folding portion FR, thereby preventing the folding portion FR from being visible or showing cracks, for example, when touched with the hand, a pen or the like. Thus, it is possible to improve the reliability of the electronic device upon a touch operation or the like.

Although not illustrated in FIGS. 10 and 11, as described above in the first embodiment, the non-folding portion UFR may also be provided with a second opening pattern (not illustrated) which has lower density than the first opening pattern 405 of the folding portion FR. The second opening pattern serves to prevent the first opening pattern 405 from being remarkably visible.

The skin layer 430 is provided in order to increase the flexibility of the back plate 4000 and is thinner than the first layer 410a. The first layer 410a has a thickness of substantially 30 μm to 200 μm, and the skin layer 430 has a thickness of substantially 10 μm to 50 μm. The thickness of the second adhesive layer 420 provided between the first layer 410a and the skin layer 430 is close to and less than the thickness of the skin layer 430. The second adhesive layer 420 may have a thickness of 5 μm to 20 μm.

The second adhesive layer 420 may be mainly formed of a thermosetting resin such as an epoxy resin, a silicon resin, a polyester resin, a polyurethane resin, or a phenol resin.

Hereinafter, a method of manufacturing the back plate of the electronic device according to the second embodiment of the present disclosure will be described.

Figure 12A:
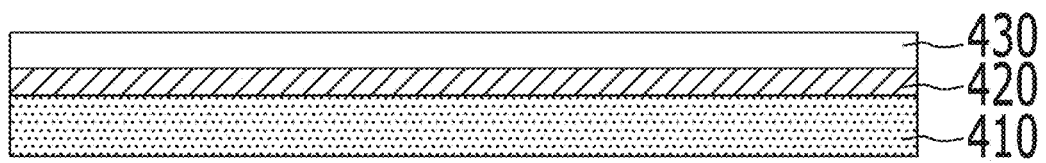
FIGS. 12A to 12C are process cross-sectional views illustrating a method of manufacturing the back plate in FIG. 11.
Figure 12B:
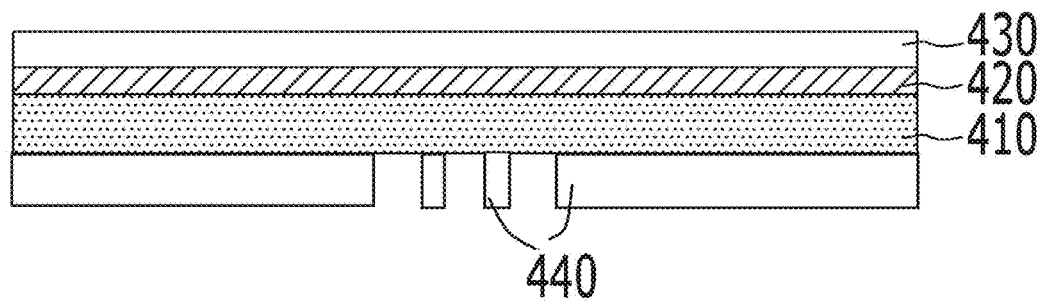
Figure 12C:
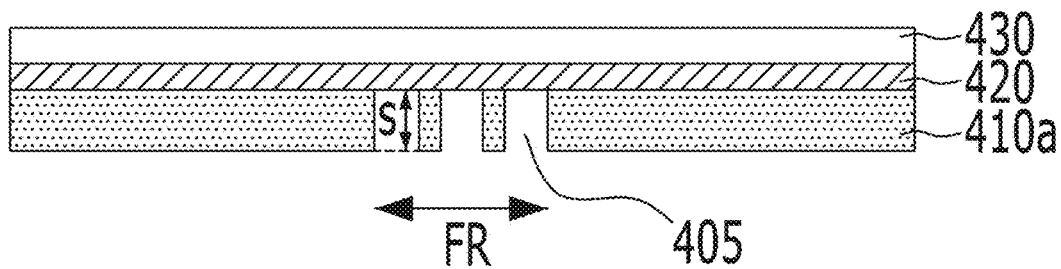

FIGS. 12A to 12C are process cross-sectional views illustrating a method of manufacturing the back plate in FIG. 11.

As illustrated in FIG. 12A, after the second adhesive layer 420 is formed on a first layer material 410, the skin layer 430 is formed on the second adhesive layer 420, so that the skin layer 430 and the first layer material 410 are bonded to each other by the second adhesive layer 420 so as to be laminated one above another.

Next, as illustrated in FIG. 12B, a photosensitive film pattern 440 is formed on the surface of the first layer material 410 which is not bonded, excluding an area in which a first opening pattern is to be formed (and a second opening pattern).

When etching the exposed first layer material 410 by applying an etchant to the area exposed by the photosensitive film pattern 440, as illustrated in FIG. 12C, the first layer 410a including the first opening pattern 405 (and the second opening pattern (not illustrated)) therein is formed. Since the second opening pattern is formed to have lower density than the first opening pattern 405, the distance between openings in the second opening pattern may be greater than that in the first opening pattern 405.

Next, by removing the photosensitive film pattern 440, the back plate 4000 may be formed in such a manner that the first opening pattern 405 is selectively formed only in the first layer 410a of the laminated structure. The second adhesive layer 420 and the skin layer 430 maintain their thicknesses after completion of the above-described process.

In the lamination stage in FIG. 12A of the above-described process, the second adhesive layer 420 may be thermally hardened. Thereby, before the etching of the first layer material 410, the second adhesive layer 420 is in a solidified state and substantially maintains the thickness thereof. Therefore, even after the etching of the first layer material 410, the second adhesive layer 420 may be exposed and visible through the first opening pattern 405. In addition, a space S having a thickness equal to or less than the thickness of the first layer 410a may be provided in the first opening pattern 405 between the second adhesive layer 420 and a surface of the first layer 410a that is not in contact with the second adhesive layer 420. That is, the space S may be provided between a first surface of the first layer 410a facing the second adhesive layer 420 and a second surface of the first layer 410a opposite to the first surface of the first layer 410a. The space S may not be exposed or open at the first surface of the first layer 410a or the second surface of the first layer 410a.

In the following description, a first layer of the completed back plate having therein the first opening pattern 405 is denoted by 410a.

Hereinafter, different forms of an opening pattern formed in the first layer according to embodiments will be described in detail.

Figure 13A:
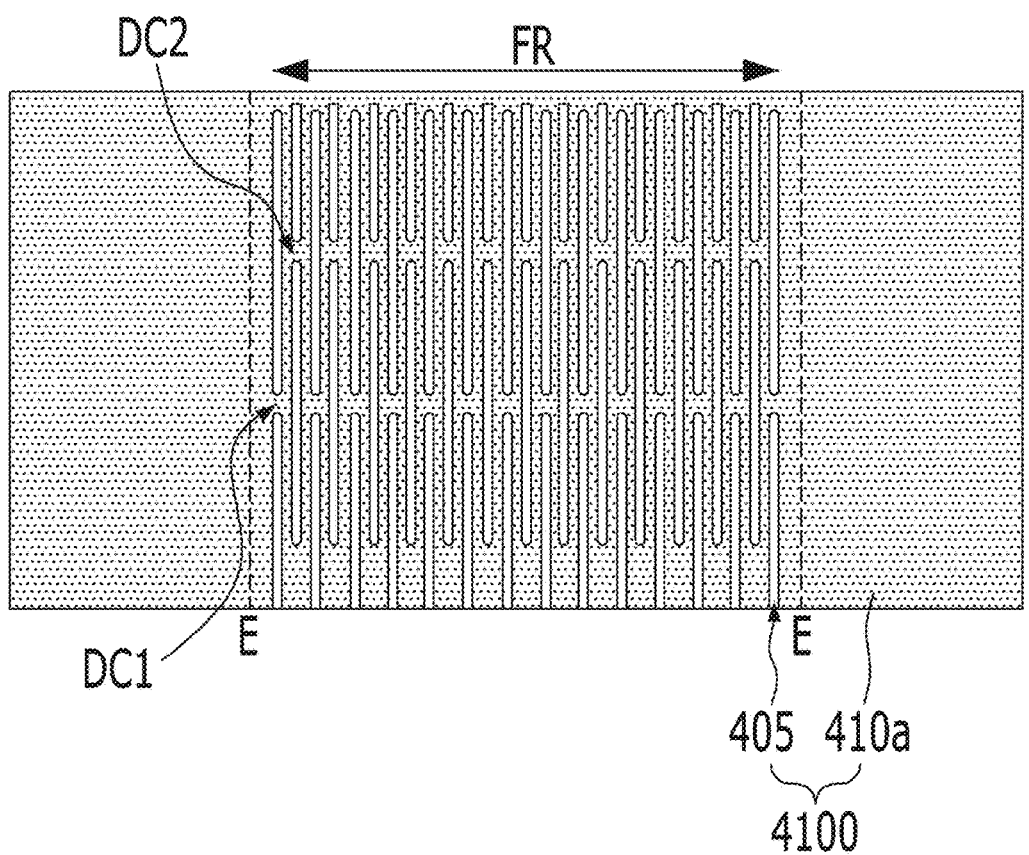
FIG. 13A is a plan view illustrating the folding portion of the back plate and the periphery thereof in FIG. 11 according to one embodiment.
Figure 13B:
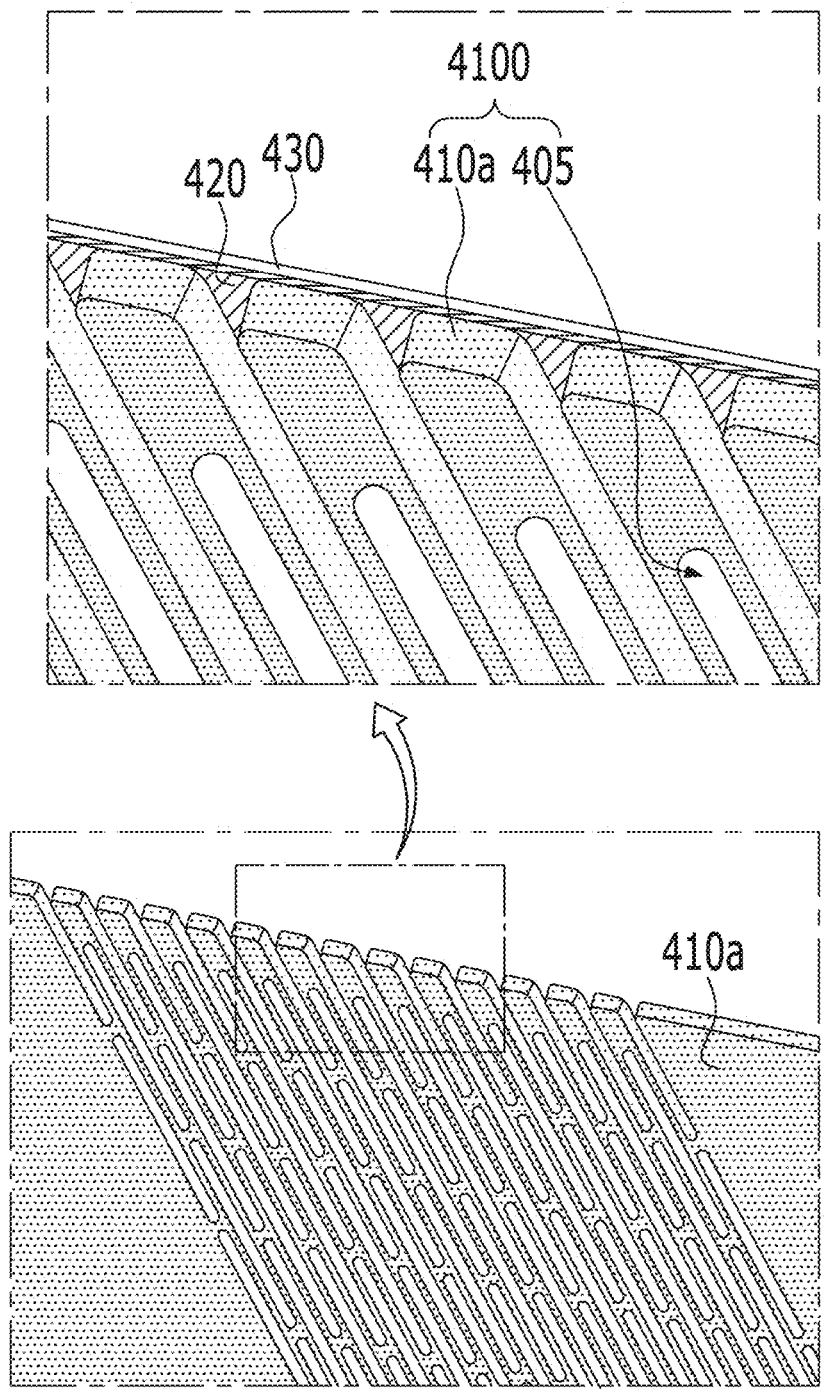
FIG. 13B is an enlarged perspective view of FIG. 13A.

FIG. 13A is a plan view illustrating the folding portion of the back plate and the periphery thereof in FIG. 11 according to one embodiment, and FIG. 13B is an enlarged perspective view of FIG. 13A.

The back plate illustrated in FIGS. 13A and 13B includes the support portion 4100 in which the first opening pattern 405 is located in each of a plurality of columns in the first layer 410a and is divided into a plurality of patterns with a discontinuous portion DC1, DC2 interposed therebetween in each column. In this case, the discontinuous portions DC between the first opening patterns 405 in neighboring columns are located in different rows. The discontinuous portions DC1, DC2 are integrally formed with the first layer 410a.

The longitudinal direction of the first opening pattern 405 may be a folding direction or a direction perpendicular to the folding direction.

In addition, the first layer 410a may have side edges along the folding portion FR. The side edges of the folding portion FR may not have any openings of the first opening patterns 405 exposed or opening thereon, and may be provided with an area having a given width. In this area, the first layer 410a maintains the thickness thereof. This serves to restore stiffness, which is reduced due to successively formed opening patterns in the first layer, in the periphery of the folding portion FR.

The first opening patterns 405 in two neighboring columns may be paired, and pairs of the first opening patterns 405 may be repeatedly arranged.

The first opening pattern 405 provided in the folding portion FR causes the hard support portion 4100 to be flexible so as to operate like a spring upon a folding operation, thereby allowing the support portion 4100 to easily return to the original state thereof without constriction and stretching stress upon a folding operation.

Figure 14A:
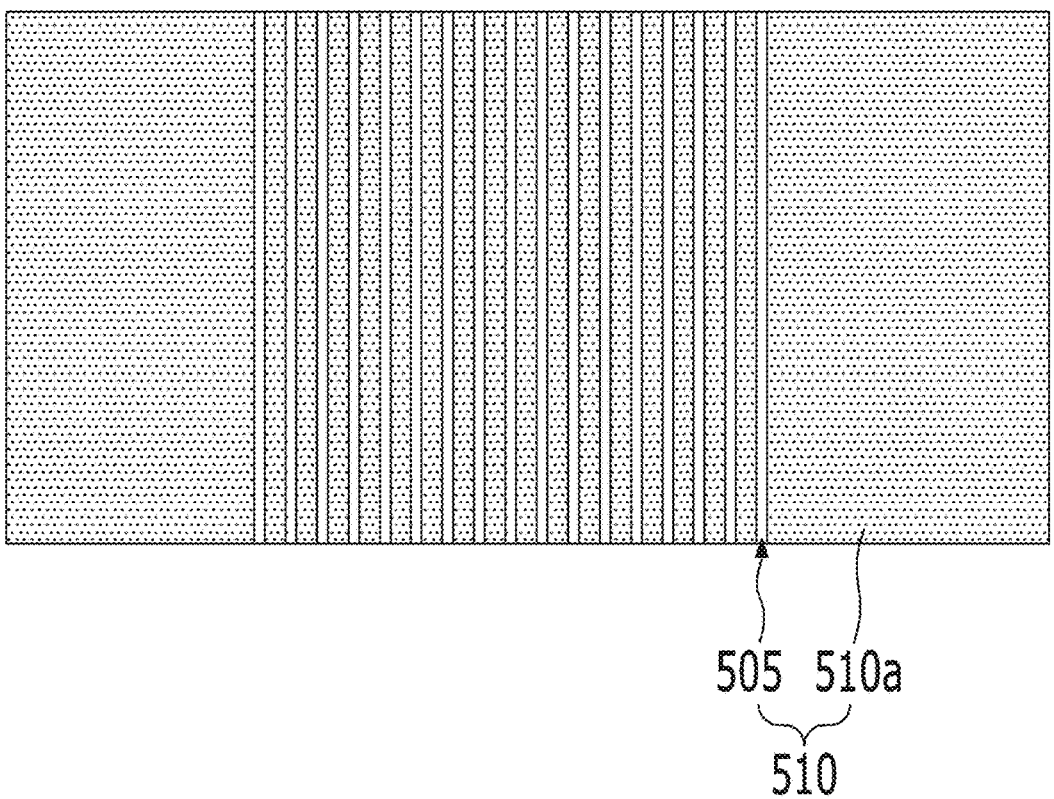
FIG. 14A is a plan view illustrating the folding portion of the back plate and the periphery thereof in FIG. 11 according to another embodiment.
Figure 14B:
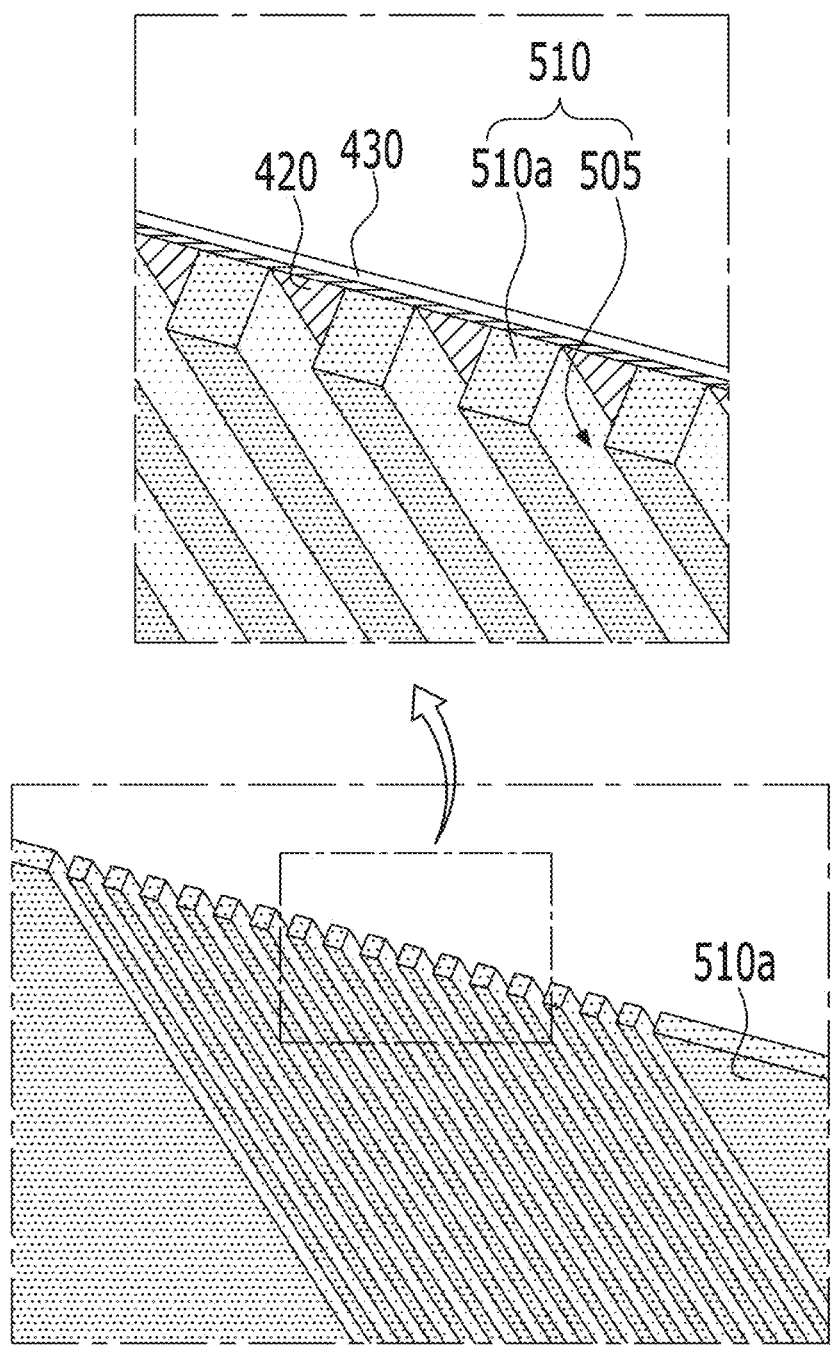
FIG. 14B is an enlarged perspective view of FIG. 14A.

FIG. 14A is a plan view illustrating the folding portion of the back plate and the periphery thereof in FIG. 11 according to another embodiment, and FIG. 14B is an enlarged perspective view of FIG. 14A.

The back plate illustrated in each of FIGS. 14A and 14B includes a support portion 510 in which a plurality of first opening patterns 505 is formed in a first layer 510a for the folding portion FR so as to be elongated in a given direction.

The first opening patterns 405, described above with reference to FIGS. 13A and 13B, have a mesh form, whereas the first opening patterns 505 illustrated in FIGS. 14A and 14B have a stripe form. Here, the longitudinal direction of the first opening pattern 505 may be a folding direction or a direction perpendicular to the folding direction.

The stripe-shaped opening pattern may have lower density in the non-folding portion than that in the folding portion. As such, in the folding portion, the hard support portion 5100 may be flexible so as to operate like a spring upon a folding operation, thereby being capable of easily returning to the original state thereof without constriction and stretching stress upon a folding operation.

In the back plate of the electronic device according to the second embodiment described above, the skin layer, which faces the first layer of the back plate with the adhesive layer interposed therebetween, is formed of an inorganic material such as amorphous silicon or an alloy having greater elastic restoration ability than the first layer. Thereby, the back plate has flexibility, and the skin layer remains in a flat shape since the adhesive layer is solidified before the formation (etching) of the opening pattern, whereby it is possible to prevent cracks in the display panel due to external force applied when in use such as a touch, for example.

Figure 15:
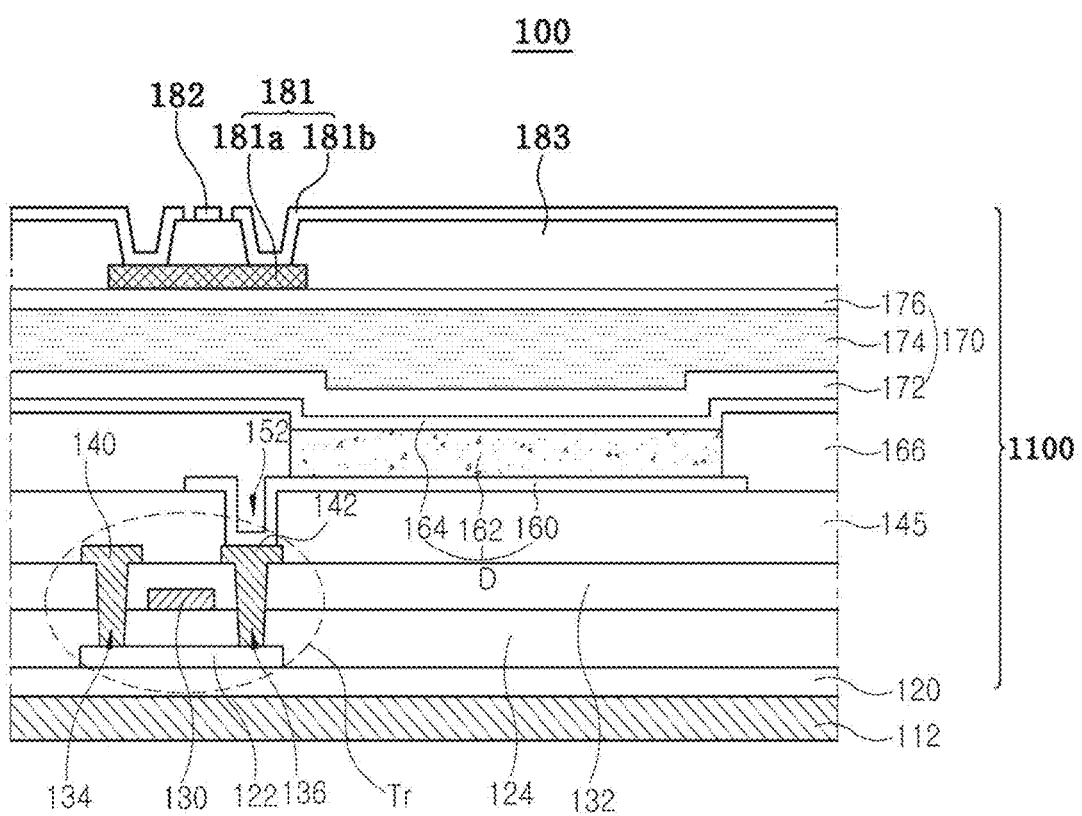
FIG. 15 is a cross-sectional view illustrating a display panel of the flexible display of the present disclosure.

FIG. 15 is a cross-sectional view illustrating the display panel 100 of the flexible display of the present disclosure.

As illustrated in FIG. 15, a buffer layer 120 is formed on a flexible substrate (the flexible base material 112), and a thin-film transistor Tr is formed on the buffer layer 120. The buffer layer 120 may be omitted.

A semiconductor layer 122 is formed on the buffer layer 120. The semiconductor layer 122 may be formed of an oxide semiconductor material or polycrystalline silicon.

When the semiconductor layer 122 is formed of an oxide semiconductor material, a light-blocking pattern (not illustrated) may be formed below the semiconductor layer 122. The light-blocking pattern prevents light from being incident on the semiconductor layer 122, thereby preventing the semiconductor layer 122 from being deteriorated by light. Unlike this, the semiconductor layer 122 may be formed of polycrystalline silicon, in which case opposite edges of the semiconductor layer 122 may be doped with a dopant.

A gate insulation layer 124 is formed on the semiconductor layer 122 using an insulating material. The gate insulation layer 124 may be formed of an inorganic insulating material such as silicon oxide or silicon nitride.

A gate electrode 130 is formed on the gate insulation layer 124 using a conductive material such as a metal so as to correspond to the center of the semiconductor layer 122.

Although the gate insulation layer 124 is illustrated as being formed over the entire surface of the flexible base material 112 in FIG. 15, the gate insulation layer 124 may alternately be patterned to have the same shape as the gate electrode 130.

An interlayer insulation film 132 is formed on the gate electrode 130 using an insulating material. The interlayer insulation film 132 may be formed of an inorganic insulating material such as silicon oxide or silicon nitride, or may be formed of an organic insulating material such as benzocyclobutene or photo-acryl.

The interlayer insulation film 132 has therein first and second contact holes 134 and 136, which expose opposite sides of the semiconductor layer 122. The first and second contact holes 134 and 136 are located at opposite sides of the gate electrode 130 so as to be spaced apart from the gate electrode 130.

Here, the first and second contact holes 134 and 136 are also formed in the gate insulation layer 124. Unlike this, when the gate insulation layer 124 is patterned to have the same shape as the gate electrode 130, the first and second contact holes 134 and 136 may be formed only in the interlayer insulation film 132.

A source electrode 140 and a drain electrode 142 are formed on the interlayer insulation film 132 using a conductive material such as a metal.

The source electrode 140 and the drain electrode 142 are located so as to be equidistantly spaced apart from the gate electrode 130, and are brought into contact with opposite sides of the semiconductor layer 122 through the first and second contact holes 134 and 136, respectively.

The semiconductor layer 122, the gate electrode 130, the source electrode 140, and the drain electrode 142 constitute the thin-film transistor Tr, and the thin-film transistor Tr functions as a driving element.

The thin-film transistor Tr may have a coplanar structure in which the gate electrode 130, the source electrode 142, and the drain electrode 144 are located on the semiconductor layer 120.

Unlike this, the thin-film transistor Tr may have an inverted staggered structure in which the gate electrode is located below the semiconductor layer and the source electrode and the drain electrode are located above the semiconductor layer. In this case, the semiconductor layer may be formed of amorphous silicon.

Although not illustrated, a gate line and a data line cross each other to define a pixel area, and a switching element is further formed so as to be connected to the gate line and the data line. The switching element is connected to the thin-film transistor Tr, which serves as the driving element.

In addition, a power line may be spaced apart from and parallel to the gate line or the data line, and a storage capacitor may further be provided in order to allow a gate electrode of the thin-film transistor Tr, serving as the driving element, to maintain a constant voltage during one frame.

A protective layer 145, which has therein a drain contact hole 152 for exposing the drain electrode 142 of the thin-film transistor Tr, is formed so as to cover the thin-film transistor Tr. Thin-film transistors Tr having the same shape described above are provided in respective pixel areas, and the thin-film transistors Tr provided on the flexible base material 112 are collectively referred to as a thin-film transistor array.

A first electrode 160 is discretely formed on the protective layer 145 for each pixel area so as to be connected to the drain electrode 142 of the thin-film transistor Tr through the drain contact hole 152. The first electrode 160 may be an anode, and may be formed of a conductive material having a relatively large work function value. For example, the first electrode 160 may be formed of a transparent conductive material such as indium-tin-oxide (ITO) or indium-zinc-oxide (IZO), or may be configured with a multilayered electrode including at least one layer of transparent conductive material.

In the case in which the display panel 100 of the present disclosure is of a top-emission type, a reflective electrode or a reflective layer may further be formed below the first electrode 160. For example, the reflective electrode or the reflective layer may be formed of an aluminum-palladium-copper (APC) alloy. In some cases, a transparent conductive material may further be provided below the reflective electrode.

In addition, a bank layer 166 is formed on the protective layer 145 so as to cover the edge of the first electrode 160. The bank layer 166 corresponds to the pixel area and exposes the center of the first electrode 160.

An organic emission layer 162 is formed on the first electrode 160. The organic emission layer 162 may take the form of a single layer formed of a light-emitting material. In addition, in order to increase luminous efficacy, the organic emission layer 162 may have a multilayered structure including a hole injection layer, a hole transport layer, a light-emitting material layer, an electron transport layer, and an electron injection layer, which are sequentially stacked on the first electrode 160.

A second electrode 164 is formed on the organic emission layer 162 above the flexible base material 112. The second electrode 164 may be located over the entirety of a display area, and may be a cathode formed of a conductive material having a relatively small work function value. For example, the second electrode 164 may be formed of any one of aluminum (Al), magnesium (Mg), and an aluminum-magnesium alloy (AlMg).

The first electrode 160, the organic emission layer 162, and the second electrode 164 constitute an organic light-emitting diode D. The organic light-emitting diode D is provided in each pixel area so as to be connected to the thin-film transistor Tr, and organic light-emitting diodes formed in all of the pixel areas are also collectively referred to as an organic light-emitting diode.

An encapsulation film 170 is formed on the second electrode 164 in order to prevent external moisture from entering the organic light-emitting diode D. The encapsulation film 170 may take the form of a stack including a first inorganic insulation layer 172, an organic insulation layer 174, and a second inorganic insulation layer 176, but is not limited thereto as long as it is formed by alternately stacking an inorganic insulation layer and an organic insulation layer so that the outermost layer is an inorganic insulation layer.

In addition, a touch electrode array including a first touch electrode 181 and a second touch electrode 182 may further be provided on the encapsulation film 170 in order to detect a touch. In the illustrated form, a bridge line 181a is provided on the second inorganic insulation layer 176, which is the outermost layer, a touch insulation layer 183 is provided on the bridge line 181a, and a first touch pattern 181b and the second touch electrode 182 are spaced apart from each other on the touch insulation layer 183. Here, the first touch pattern 181b is electrically connected to the bridge line 181a through a contact hole in the touch insulation layer 183 so as to configure the first touch electrode 181. In the drawing, only a portion of the second touch electrode 182 is illustrated. The second touch electrode 182 is located on a portion of the touch insulation layer 183 in which the first touch pattern 181b is not located, and generates mutual capacitance Cm between first and second touch patterns 181b that are spaced apart from each other.

The presence or absence of a touch may be detected based on variation in mutual capacitance Cm.

The illustrated touch electrode array is given by way of example, and the disclosure is not limited thereto. Although the touch electrode array may be directly formed on the encapsulation film 170, as illustrated, a separate material or insulation layer may further be provided so that the touch electrode array is disposed thereon, or the touch electrode array may be provided inside a cover film. In some cases, the encapsulation film 170 may be located on the top of the display panel 100 without providing the touch electrode array.

A polarizer (not illustrated) may be attached on the touch electrode array in order to reduce the reflection of external light. For example, the polarizer may be a circular polarizer. Alternatively, a cover layer such as a cover window may further be provided in order to protect the top of the touch electrode array.

Reference numeral "1100", not described above, denotes an array structure including all of an array of the thin-film transistors Tr formed on the flexible base material 112, an array of the organic light-emitting diodes D connected to the respective thin-film transistors Tr, the encapsulation layer 170 covering the aforementioned constituents, and a touch electrode array 181, 182 and 183.

The display panel described above is given by way of example, and is an organic light-emitting display panel, but may be replaced with any other type of display panel as long as it is flexible. For example, the organic light-emitting display panel described above may be replaced with a flexible liquid-crystal panel, a flexible quantum-dot display panel, or a flexible electrophoretic display panel.

As is apparent from the above description, a flexible display and an electronic device including the same according to the present disclosure have the following effects.

First, a back plate, which serves to support a display panel, is configured in a manner such that opening patterns having different specific gravities are provided in a folding portion and a non-folding portion thereof. Thereby, it is possible to enable the back plate to perform a folding operation in response to a folding operation of the display panel, and to prevent a difference in patterns between the folding portion and the non-folding portion from being visible during unfolding.

Second, the surface of the back plate is provided with a skin layer, which has stiffness lower than that of a main body of the back plate, so that the opening patterns are filled with the material of the skin layer, which may prevent the opening patterns from being visible due to an empty space.

Third, in addition to providing the opening pattern in the folding portion, the opening pattern in the non-folding portion has sequential or gradual variation in density, which may reduce a difference in stiffness between areas of the back plate and prevent unbalance in shape due to sagging of a specific area.

Fourth, in the back plate of the electronic device, the skin layer, which faces the first layer of the back plate with the adhesive layer interposed therebetween, is formed of an inorganic material such as amorphous silicon or an alloy having greater elastic restoration ability than the first layer. Thereby, the back plate has flexibility, and the skin layer remains in a flat shape since the adhesive layer is solidified before the formation (etching) of the opening pattern, whereby it is possible to prevent cracks in the display panel due to external force applied when in use such as a touch, for example.

Although the embodiments of the present disclosure have been described above in detail with reference to the accompanying drawings, it will be apparent to those skilled in the art that the present disclosure described above is not limited to the embodiments described above, and various substitutions, modifications, and alterations may be devised within the spirit and scope of the present disclosure. Thus, such modifications should be considered to fall within the scope of the present disclosure, and the true technical scope of the present disclosure should be determined by the technical ideas of the claims to be set forth below.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A flexible display, comprising:
   a display panel; and
   a back plate divided into a folding portion and a non-folding portion, the back plate including
      a first layer formed of a material having stiffness higher than a stiffness of the display panel,
      a first opening pattern formed in the first layer and corresponding to the folding portion, the first opening pattern having a first density of empty space, and
      a second opening pattern formed in the first layer and corresponding to the non-folding portion, the second opening pattern having a second density of empty space lower than the first density.

2. The flexible display according to claim 1, wherein the non-folding portion is divided into two or more areas, a first area of the two or more areas includes the second opening pattern having the second density, and a second area of the two or more areas includes a third opening pattern having a density of empty space different from the first and second densities.

3. The flexible display according to claim 2, wherein the second density of a portion of the second opening pattern at a first distance from the folding portion is lower than the first density, and the third density of a portion of the third opening pattern at a second distance from the folding portion is lower than the second density, the second distance being greater than the first distance.

4. The flexible display according to claim 1, wherein the first density is uniform in the folding portion, and
   wherein the second density decreases in the non-folding portion with increasing distance from the folding portion.

5. The flexible display according to claim 1, wherein the first layer includes at least one of stainless steel, amorphous metal, amorphous silicon, and Invar.

6. The flexible display according to claim 1, wherein the back plate further comprises a skin layer on at least one surface of the first layer.

7. The flexible display according to claim 1, further comprising a first adhesive layer between the display panel and the back plate.

8. The flexible display according to claim 6, wherein the skin layer is formed of a resin.

9. The flexible display according to claim 8, wherein at least one of the first opening pattern and the second opening pattern is filled with the resin.

10. The flexible display according to claim 6, wherein the back plate further comprises an adhesive layer between the first layer and the skin layer.

11. The flexible display according to claim 10, wherein the skin layer has a higher elastic restoration ability than the first layer.

12. The flexible display according to claim 11, wherein the skin layer includes at least one of stainless steel, amorphous metal, amorphous silicon, and Invar.

13. The flexible display according to claim 10, wherein the adhesive layer is exposed by the first and second opening patterns.

14. The flexible display according to claim 10, wherein a space is provided within at least one of the first and second opening patterns between the adhesive layer and a surface of the first layer that is not in contact with the adhesive layer, and wherein a thickness of the space is equal to or less than a thickness of the first layer.

15. The flexible display according to claim 1, wherein the first opening pattern includes openings arranged in a plurality of columns in the folding portion.

16. The flexible display according to claim 1, wherein the first opening pattern is divided into a plurality of patterns each having columns with a discontinuous portion separating adjacent openings in each column.

17. The flexible display according to claim 16, wherein a first discontinuous portion in a first column is located in a different row than a second discontinuous portion in a second column adjacent to the first column.

18. The flexible display according to claim 11, wherein the skin layer has a thickness that is thinner than a thickness of the first layer.

19. The flexible display according to claim 1, the folding portion having edges without an opening of the first opening pattern exposed on the edges.

20. An electronic device, comprising:
   a display panel;
   a back plate divided into a folding portion and a non-folding portion, the back plate including
      a first layer formed of a material having stiffness higher than a stiffness of the display panel,
      a first opening pattern formed in the first layer and corresponding to the folding portion, the first opening pattern having a first density of empty space, and
      a second opening pattern formed in the first layer and corresponding to the non-folding portion, the second opening pattern having a second density of empty space lower than the first density; and
   a case accommodating the display panel and the back plate therein.

* * * * *